United States Patent
Chen et al.

(10) Patent No.: US 12,002,751 B2
(45) Date of Patent: Jun. 4, 2024

(54) ADJUSTMENT METHOD AND DEVICE FOR CHIP OUTPUT CHARACTERISTICS

(71) Applicant: CHANGXIN MEMORY TECHNOLOGIES, INC., Hefei (CN)

(72) Inventors: Liang Chen, Hefei (CN); Yangyang Yin, Hefei (CN); Bohong Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 409 days.

(21) Appl. No.: 17/446,616

(22) Filed: Aug. 31, 2021

(65) Prior Publication Data

US 2022/0139830 A1    May 5, 2022

Related U.S. Application Data (63) Continuation of application No. PCT/CN2021/106197, filed on Jul. 14, 2021.

(30) Foreign Application Priority Data

Oct. 29, 2020 (CN) .......................... 202011186475.6

(51) Int. Cl.
*H01L 23/525* (2006.01)
*G01R 31/28* (2006.01)

(52) U.S. Cl.
CPC ...... *H01L 23/5256* (2013.01); *G01R 31/2851* (2013.01)

(58) Field of Classification Search
CPC .... G01R 31/2851–2898; H01L 23/5252–5258
See application file for complete search history.

(56) References Cited

U.S. PATENT DOCUMENTS 6,675,360 B1 * 1/2004 Cantone ......... G01R 31/318572
702/132
8,724,405 B2    5/2014 Kim
(Continued)

FOREIGN PATENT DOCUMENTS

CN    100375196 C    3/2008
CN    103531576 A    1/2014
(Continued)

OTHER PUBLICATIONS

First Office Action of the Chinese application No. 202011186475.6, issued on Mar. 31, 2023.
(Continued)

*Primary Examiner* — Evan G Clinton
(74) *Attorney, Agent, or Firm* — Syncoda LLC; Feng Ma (57) ABSTRACT

An adjustment method for the chip output characteristics can include the following steps. When adjusting the output characteristics of the chip to be tested, first it is determined whether the output characteristics of the chip to be tested have been adjusted according to the state of each E-fuse. When determining that the output characteristics of the chip to be tested have not been adjusted, the target adjustment solution corresponding to the chip is determined among a plurality of adjustment solutions in a targeted manner according to the output performance of the chip to be tested. The E-fuse in the chip to be tested is subjected to blowing treatment according to the target adjustment solution, so as to adjust the output characteristics of the chip to be tested.

20 Claims, 4 Drawing Sheets

(56) References Cited

U.S. PATENT DOCUMENTS

| | | |
|---|---|---|
| 8,873,313 B2 | 10/2014 | Kim |
| 2013/0279274 A1 | 10/2013 | Kim |
| 2014/0226419 A1 | 8/2014 | Kim |

FOREIGN PATENT DOCUMENTS

| | | | |
|---|---|---|---|
| CN | 104597393 A | | 5/2015 |
| CN | 105470159 A | | 4/2016 |
| CN | 105551993 A | * | 5/2016 |
| CN | 106370996 A | | 2/2017 |
| CN | 106405374 A | | 2/2017 |
| CN | 106443399 A | | 2/2017 |
| CN | 106771991 A | | 5/2017 |
| CN | 106782671 A | | 5/2017 |
| CN | 206178094 U | | 5/2017 |
| CN | 106960822 A | | 7/2017 |
| CN | 107607851 A | | 1/2018 |
| CN | 107785306 A | | 3/2018 |
| CN | 109360595 A | | 2/2019 |
| CN | 110133474 A | | 8/2019 |
| CN | 111539165 A | | 8/2020 |
| CN | 111638441 A | | 9/2020 |
| CN | 111766509 A | | 10/2020 |
| CN | 111817924 A | | 10/2020 |

OTHER PUBLICATIONS

International Search Report in the international application No. PCT/CN2021/106197, mailed on Sep. 28, 2021.

Written Opinion of the International Search Authority in the international application No. PCT/CN2021/106197, mailed on Sep. 28, 2021.

* cited by examiner

ADJUSTMENT METHOD AND DEVICE FOR CHIP OUTPUT CHARACTERISTICS

CROSS-REFERENCE TO RELATED APPLICATIONS

This application is a continuation of International Patent Application No. PCT/CN2021/106197 filed on Jul. 14, 2021, which claims priority to Chinese Patent Application No. 202011186475.6 filed on Oct. 29, 2020. The disclosures of these applications are hereby incorporated by reference in their entirety.

BACKGROUND

In a chip manufacturing process, the characteristics of a manufactured chip have great deviations from a design simulation value due to the influence of process deviations, circuit mismatching, different chip production batches and other factors, thereby resulting in great deviations between the chip output characteristics and the expected characteristics.

SUMMARY

This application relates generally to the field of semiconductor chip technologies, and more specifically to an adjustment method and device for chip output characteristics.

According to a first aspect, embodiments of this application provide an adjustment method for chip output characteristics, and the adjustment method for the chip output characteristics includes the following operations. The state of each E-fuse in a chip to be tested is detected. If detecting that no E-fuse is blown, a target adjustment solution corresponding to the chip is determined among a plurality of adjustment solutions according to the output performance of the chip to be tested. The E-fuse in the chip to be tested is subjected to blowing treatment according to the target adjustment solution, such that the output characteristics of the chip to be tested are adjusted.

According to a second aspect, embodiments of this application provide an adjustment device for chip output characteristics, and the adjustment device for the chip output characteristics includes a detection unit and a processing unit. The detector is configured to detect the state of each E-fuse in a chip to be tested. The processor is configured to determine a target adjustment solution corresponding to the chip among a plurality of adjustment solutions according to the output performance of the chip to be tested if detecting that no E-fuse is blown; and to perform blowing treatment on the E-fuse in the chip to be tested according to the target adjustment solution, so as to adjust the output characteristics of the chip to be tested.

According to a third aspect, embodiments of this application further provide an adjustment device for chip output characteristics, and the adjustment device for the chip output characteristics includes a memory and a processor. The memory is configured to store a computer program. The processor is configured to read the computer program stored in the memory, and to execute the adjustment method for the chip output characteristics in any one possible implementation mode of the first aspect according to the computer program in the memory.

BRIEF DESCRIPTION OF THE DRAWINGS

The drawings herein are incorporated into the specification and constitute part of this disclosure, show the embodiment conforming to the disclosure, are used together with the specification to explain the principles of the disclosure.

Some embodiments of the disclosure have been shown by above drawings and will be described in details below. Descriptions of these drawings and text are not intended to limit the scope of the idea of the disclosure in any way, but rather to illustrate the concept of the disclosure for those skilled in the art with reference to specific embodiments.

DETAILED DESCRIPTION

Exemplary embodiments are described here in detail, examples of which are represented in the drawings. Unless otherwise indicated, where the following descriptions relate to drawings, the same numbers in different drawings indicate the same or similar elements. The implementation modes described in the following exemplary embodiments do not represent all implementation modes consistent with the disclosure. Instead, they are merely examples of devices and methods consistent with some aspects of the disclosure as detailed in the attached claims.

In the embodiments of this application, "at least one" means one or more, and "a plurality of" means two or above two. "And/or" describes an association relationship of the associated objects, indicating that there may be three kinds of relationships. For example, A and/or B may indicate that A exists alone, A and B coexist, and B exists alone. A and B may be singular or plural. In the text description of this application, the character "/" generally indicates that the front and rear associated objects is a "or" relationship.

To improve the consistency of the chip output characteristics, a uniform adjustment solution can be adopted to burn an Electrically Programmable Fuse (E-fuse) in the chip. However, a great number of chip characteristics have different performances in a back-end testing process. As such, the consistency of the chip output characteristics often cannot be ensured, and it can be difficult to control the quality of chip shipment.

Various embodiments of the present disclosure can address how to adjust the chip output characteristics to ensure the consistency of the output characteristics of the adjusted chip of the adjusted chip in the testing process.

Figure 1:
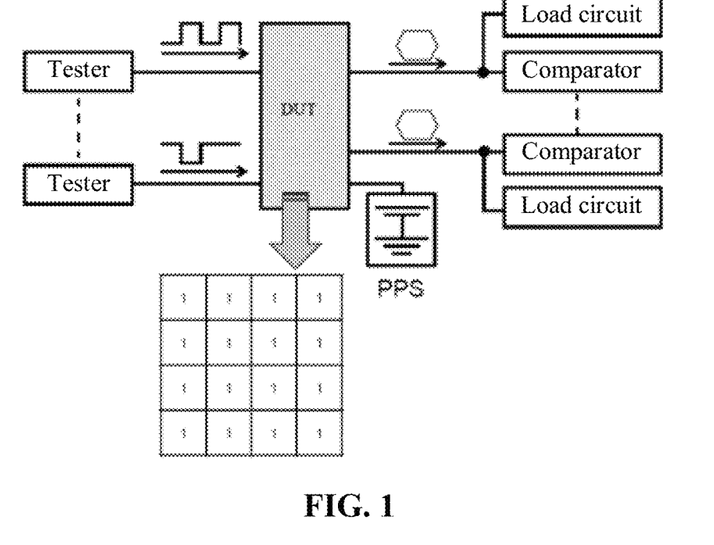
FIG. 1 is a schematic diagram of an application scene according to embodiments of this application.

An adjustment method for the chip output characteristics provided by the embodiments of this application can be applied in the scene of the chip test. In a chip manufacturing process, the characteristics of a manufactured chip have great deviations from a design simulation value due to the influence of process deviations, circuit mismatching, different chip production batches and other factors, thereby resulting in great deviations between the chip output characteristics and the expected characteristics, and the deviation will affect the quality of the chip shipment. In order to ensure the quality of the chip shipment, usually, workers will test the output characteristics and other characteristics of the chip before shipment. Exemplarily, referring to FIG. 1, which is a schematic diagram of an application scene according to embodiments of this application, a testing machine or a great number of chips to be tested can be included in this application scene, and the testing machine includes a plurality of Devices Under Test (DUT). When the output characteristics of a great number of chips to be tested are detected, tester can place the chips to be tested in DUT of the testing machine, and an instruction and data are written to the chips by a driver channel of the machine, so as to achieve the control of the chips. Herein, a comparator is configured to judge whether or not the data output by the chip meets an expected value. The burning for E-fuse in the chip to be tested in DUT is only one part of inputting the instruction, so as to achieve the purpose of adjusting the output characteristics of the chip to be tested.

For different chips to be tested, a corresponding adjustment solution of the chip can be selected in a targeted manner instead of adopting the uniform adjustment solution. The E-fuse of the chip to be tested is selectively burned based on the corresponding adjustment solution, so as to ensure the consistency of the output characteristics of the adjusted chip. When considering that the adjustment solution corresponding to the chip to be tested is selected in a targeted manner, the output performance is an important factor for describing the chip output characteristics. Therefore, based on the output performance of the chip to be tested, the corresponding adjustment solution for the chip to be tested is selected in a targeted manner, and based on the corresponding adjustment solution, the E-fuse of the chip to be tested is burned in a targeted manner, so as to ensure the consistency of the output characteristics of the adjusted chip.

Based on the above concept, embodiments of this application provide an adjustment method for the chip output characteristics. When testing the chip output characteristics, the state of each E-fuse in the chip to be tested is detected first. If detecting that no E-fuse is blown, it is indicated that the output characteristics of the chip to be tested have not been adjusted, and the target adjustment solution corresponding the chip is determined in the plurality of adjustment solutions according to the output performance of the chip to be tested. The E-fuse in the chip to be tested is subjected to blowing treatment according to the target adjustment solution, so as to adjust the output characteristics of the chip to be tested.

Herein, the output characteristics refer to some test items for evaluating chip output in the back-end test, and the specific reference content of the output characteristics can be set according to the actual needs. Embodiments of this application do not make further limitations herein.

Exemplarily, in the embodiments of this application, taking that the chip to be tested includes four E-fuses, which are the E-fuse 0, the E-fuse 1, the E-fuse 2 and the E-fuse 3 as an example, the initial states of the four E-fuses can be detected first. If the states of the four E-fuses are not blown, it is indicated that the output characteristics of the chip to be tested have not been adjusted. On the contrary, if the E-fuse is blown in the states of the four E-fuses, it is indicated that the output characteristics of the chip to be tested have been adjusted.

It should be understood that, in the embodiments of this application, if detecting that at least one E-fuse is blown in the chip, it is indicated that the output characteristics of the chip to be tested have been adjusted. In this case, the chip to be tested can be directly turned off in order to avoid adjusting the output characteristics of the adjusted chip again and generating chaos.

The adjustment method for the chip output characteristics provided by the embodiments of this application is described in details below through the specific embodiments. It should be understood that, in the embodiments of this application, the several specific embodiments below can be mutually combined, and the same or similar concept or process cannot be described again in some embodiments.

Figure 2:
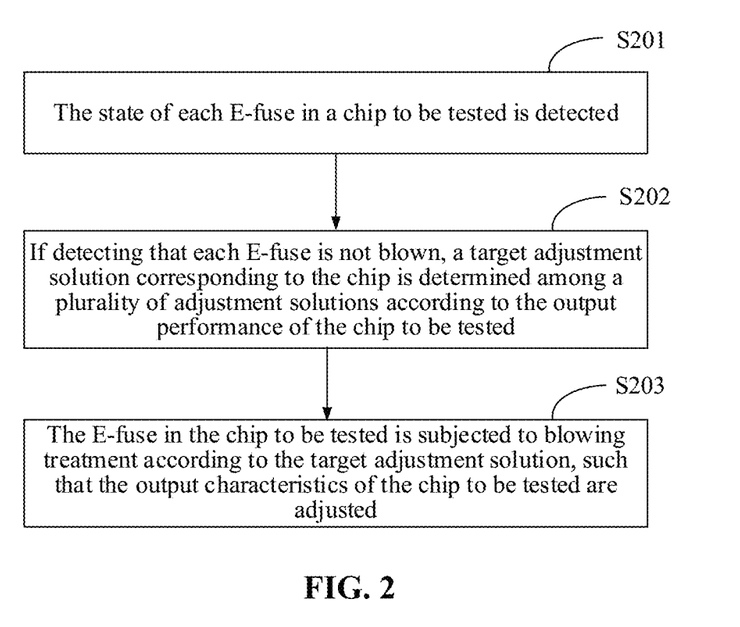
FIG. 2 is a flow schematic diagram of an adjustment method for chip output characteristics according to embodiments of this application.

FIG. 2 is a flow schematic diagram of an adjustment method for chip output characteristics according to embodiments of this application. The adjustment method for the chip output characteristics can be executed by a software and/hardware device, and the hardware device can be the testing machine of the chip. Exemplarily, referring to FIG. 2, the adjustment method for the chip output characteristics includes the following operations.

At S201, the state of each E-fuse in a chip to be tested is detected.

Herein, the state of the E-fuse can include a blown state or a non-blown state.

Taking that the chip to be tested includes four E-fuses, which are the E-fuse 0, the E-fuse 1, the E-fuse 2 and the E-fuse 3 as an example, the state of each E-fuse in the E-fuse 0, the E-fuse 1, the E-fuse 2 and the E-fuse 3 needs to be respectively detected, thus after respectively detecting the state of each E-fuse, the following S202 can be executed.

At S202, if detecting that no E-fuse is blown, a target adjustment solution corresponding to the chip is determined among a plurality of adjustment solutions according to the output performance of the chip to be tested.

The output performance is two groups of data description output by one clock signal. Exemplarily, the two groups of data output by the clock signal can be EVEN data and ODD data, or the performance form of another two groups of data. Herein, the embodiments of this application illustrate by taking the two groups of data output by the clock signal: EVEN data and ODD data as an example, but does not mean that the embodiments of this application are limited to this.

Exemplarily, if the state of each E-fuse in the E-fuse 0, the E-fuse 1, the E-fuse 2 and the E-fuse 3 is not blown, it is indicated that the output characteristics of the chip to be tested have not been adjusted. In this case, the next operation can be carried out, and the output characteristics of the chip to be tested are adjusted by adopting the technical solution in the embodiments of this application. On the contrary, if least one E-fuse in the E-fuse 0, the E-fuse 1, the E-fuse 2 and the E-fuse 3 is blown, it is indicated that the output characteristics of the chip to be tested have been adjusted. In this case, the chip to be tested can be directly turned off in order to avoid adjusting the output characteristics of the adjusted chip again and generating chaos.

Exemplarily, when the target adjustment solution corresponding to the chip is determined in the plurality of adjustment solutions according to the output performance of the chip to be tested, the absolute difference of two groups of data of the chip to be tested can be calculated by the plurality of adjustment solutions first, the absolute difference corresponding to each adjustment solution is obtained, and the minimum absolute difference is determined in the plurality of absolute differences. The adjustment solution corresponding to the minimum absolute difference is determined as the target adjustment solution corresponding to the chip to be tested, and the target adjustment solution can be understood as the optimal adjustment solution suitable for the chip to be tested in the plurality of adjustment solutions.

After determining the target adjustment solution corresponding to the chip to be tested, the E-fuse in the chip to be tested can directly be subjected to blowing treatment according to the target adjustment solution, such that the output characteristics of the chip to be tested are adjusted, namely, S203 is executed.

At S203, the E-fuse in the chip to be tested is subjected to blowing treatment according to the target adjustment solution, such that the output characteristics of the chip to be tested are adjusted.

When the E-fuse in the chip to be tested is subjected to blowing treatment according to the target adjustment solution, which E-fuse to be blown needs to be determined first, such that the purpose of adjusting the output characteristics of the chip to be tested can be achieved through the E-fuse.

Exemplarily, when determining to fuse which E-fuse, the target E-fuse corresponding to the target adjustment solution can be found first according to a mapping relationship between the adjustment solution and the E-fuse. The target E-fuse is the E-fuse to be blown, the target E-fuse is blown, and other E-fuses other than the target E-fuse in the chip to be tested are not blown. Other E-fuses other than the target E-fuse in the chip to be tested are directly turned off, so as to avoid other E-fuses being in a working state and affecting the adjustment on the chip to be tested.

Thus it can be seen that when the output characteristics of the chip to be tested are adjusted by adopting the technical solution provided by the embodiments of this application, whether or not the output characteristics of the chip to be tested are adjusted is determined according to the state of each E-fuse, and when determining that the output characteristics of the chip to be tested are not adjusted, the target adjustment solution corresponding to the chip is determined among a plurality of adjustment solutions in a targeted manner according to the output performance of the chip to be tested, and the E-fuse in the chip to be tested is subjected to blowing treatment according to the target adjustment solution, so as to adjust the output characteristics of the chip to be tested. The adjustment on the output characteristics of the chip is achieved during the testing process, such that the consistency of the output characteristics of the adjusted chip is ensured.

Based on the embodiment shown in FIG. 2, after the E-fuse in the chip to be tested is subjected to blowing treatment according to the target adjustment solution, the state of each E-fuse in the chip to be tested can be detected again, and the blowing result of the E-fuse is detected according to the state of each E-fuse, so as to determine the blowing accuracy. In addition, when testing the chip to be tested, not only the output characteristics of the chip to be tested need to be adjusted, but also other characteristics need to be tested. Therefore, in order to not affect the test of other characteristics, after adjusting the output characteristics of the chip to be tested, the output characteristics of the chip to be tested can be recovered before the blowing treatment, so the initial output characteristics of the chip to be tested are tested. Under the output characteristics of the chip to be tested, other characteristics of the chip to be tested are tested, thereby improving the accuracy of the testing result.

In addition, after the E-fuse in the chip to be tested is subjected to blowing treatment according to the target adjustment solution, the output characteristics of the adjusted chip to be tested can be tested in order to determine the adjustment effect, and the initial output characteristics of the chip to be tested are compared with the output characteristics of the adjusted chip to be tested, such that the adjustment effect is determined according to the comparison result. Herein, the initial output characteristics are obtained by testing before the E-fuse in the chip to be tested is subjected to blowing treatment.

In order to facilitate the understanding of the technical solution provided by the embodiments of this application, when the output characteristics of the chip to be tested are tested below by the testing machine, assuming that the chip to be tested includes four E-fuses, which are the E-fuse 0, the E-fuse 1, the E-fuse 2 and the E-fuse 3. During the testing process, the testing machine can detect the initial state of each E-fuse in the four E-fuses in the chip to be tested first, and the state of the E-fuse includes the blown state or the non-blown state. When respectively detecting the state of each E-fuse, if the state of each E-fuse in the E-fuse 0, the E-fuse 1, the E-fuse 2 and the E-fuse 3 is not blown, it is indicated that the output characteristics of the chip to be tested have not been adjusted. In this case, the next operation can be carried out, and the output characteristics of the chip to be tested are adjusted by adopting the technical solution in the embodiments of this application. On the contrary, if at least one E-fuse in the E-fuse 0, the E-fuse 1, the E-fuse 2 and the E-fuse 3 is blown, it is indicated that the output characteristics of the chip to be tested have been adjusted. In this case, the chip to be tested can be directly turned off in order to avoid adjusting the output characteristics of the adjusted chip again and generating chaos.

Assuming that the state of each E-fuse in the chip to be tested is not blown, the target adjustment solution corresponding to the chip is determined in the plurality of adjustment solutions according to the output performance of the chip to be tested. When the target adjustment solution corresponding to the chip is determined in the plurality of adjustment solutions according to the output performance of the chip to be tested, assuming that there are seven adjustment solutions, which are level 1 (LEV1), LEV 2, LEVE 3, LEV 4, LEV 5, LEV 6 and LEV 7. Going through each adjustment solution, the absolute difference of two groups of data of EVEN data and OOD data of the chip to be tested in each adjustment solution is respectively calculated, the obtained seven absolute differences are compared to determine the minimum absolute difference, and then the adjustment solution corresponding to the minimum absolute difference is determined as the target adjustment solution corresponding to the chip to be tested, namely, the optimal adjustment solution suitable for the chip to be tested in the plurality of adjustment solutions.

Assuming that the adjustment solution corresponding to the minimum absolute difference is LEV4, namely, the adjustment solution LEV4 in the seven adjustment solutions is the optimal adjustment solution suitable for the chip to be tested, so the E-fuse in the chip to be tested can be blown according to the optimal adjustment solution LEV4. When the E-fuse in the chip to be tested is blown according to the optimal adjustment solution LEV4, since the mapping relationship between the adjustment solution and the E-fuse is preset, the target E-fuse corresponding to the target adjustment plane LEV4 can be found according to the mapping relationship between the adjustment solution and the E-fuse, as shown in Table 1, which is the mapping relationship between the adjustment solution and the E-fuse according to embodiments of this application.

TABLE 1

| Adjustment solution | E-fuse 0 | E-fuse 1 | E-fuse 2 | E-fuse 3 |
|---|---|---|---|---|
| LEV1 | N | N | N | N |
| LEV2 | Y | N | N | N |
| LEV3 | N | Y | N | N |
| LEV4 | Y | Y | N | N |
| LEV5 | N | N | Y | N |
| LEV6 | N | N | N | Y |
| LEV7 | N | N | Y | Y |

It can be seen in combination with Table 1 that: when target adjustment solution is LEV1, the E-fuse in the chip to be tested does not need to be blown. When the target adjustment solution is LEV2, the E-fuse 0 in the chip to be tested can be blown, the output characteristics of the chip to be tested are adjusted by blowing the E-fuse 0, such that the consistency of the output characteristics of the adjusted chip is ensured. When the target adjustment solution is LEV3, the E-fuse 1 in the chip to be tested can be blown, the output characteristics of the chip to be tested are adjusted by blowing the E-fuse 1, such that the consistency of the output characteristics of the adjusted chip is ensured. When the target adjustment solution is LEV4, the E-fuse 0 or E-fuse 1 in the chip to be tested can be blown, the output characteristics of the chip to be tested are adjusted by blowing the E-fuse 0 or the E-fuse 1, such that the consistency of the output characteristics of the adjusted chip is ensured. When the target adjustment solution is LEV5, the E-fuse 2 in the chip to be tested can be blown, the output characteristics of the chip to be tested are adjusted by blowing the E-fuse 2, such that the consistency of the output characteristics of the adjusted chip is ensured. When the target adjustment solution is LEVE, the E-fuse 3 in the chip to be tested can be blown, the output characteristics of the chip to be tested are adjusted by blowing the E-fuse 3, such that the consistency of the output characteristics of the adjusted chip is ensured. When the target adjustment solution is LEV7, the E-fuse 2 or E-fuse 3 in the chip to be tested can be blown, the output characteristics of the chip to be tested are adjusted by blowing the E-fuse 2 or the E-fuse 3, such that the consistency of the output characteristics of the adjusted chip is ensured.

Figure 3:
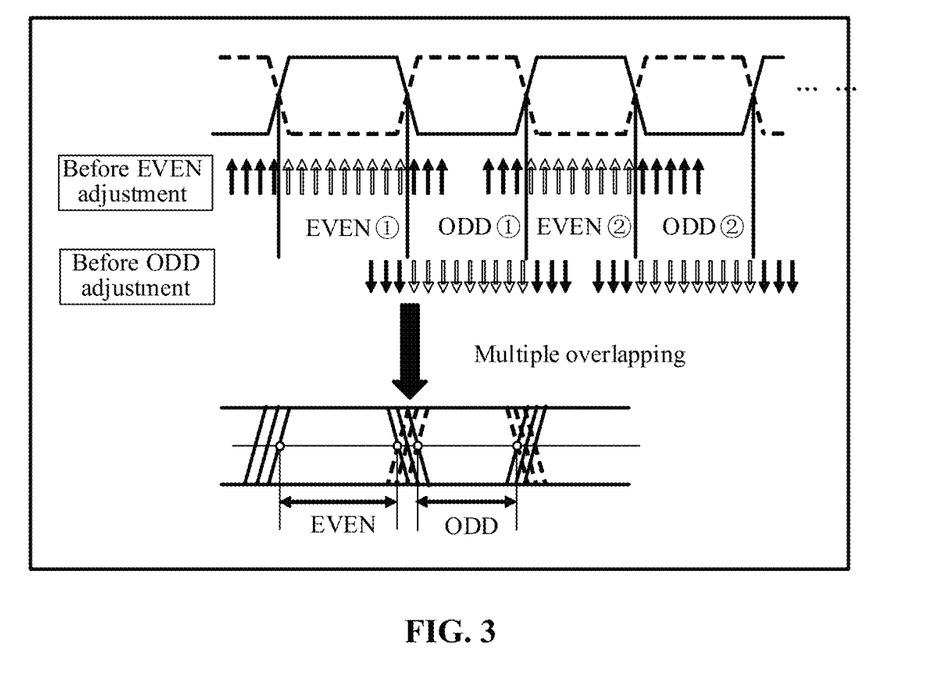
FIG. 3 is a schematic diagram of chip output characteristics according to embodiments of this application.
Figure 4:
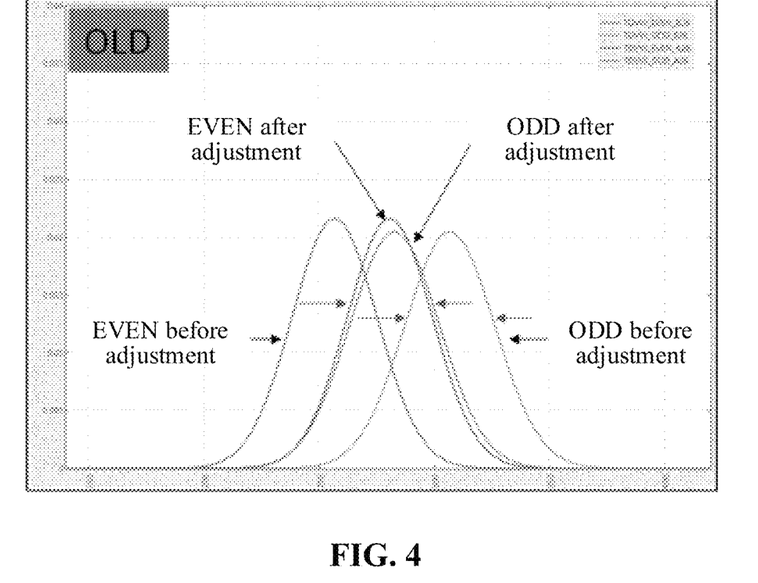
FIG. 4 is a schematic diagram of chip output characteristics adjusted by a related art according to embodiments of this application.
Figure 5:
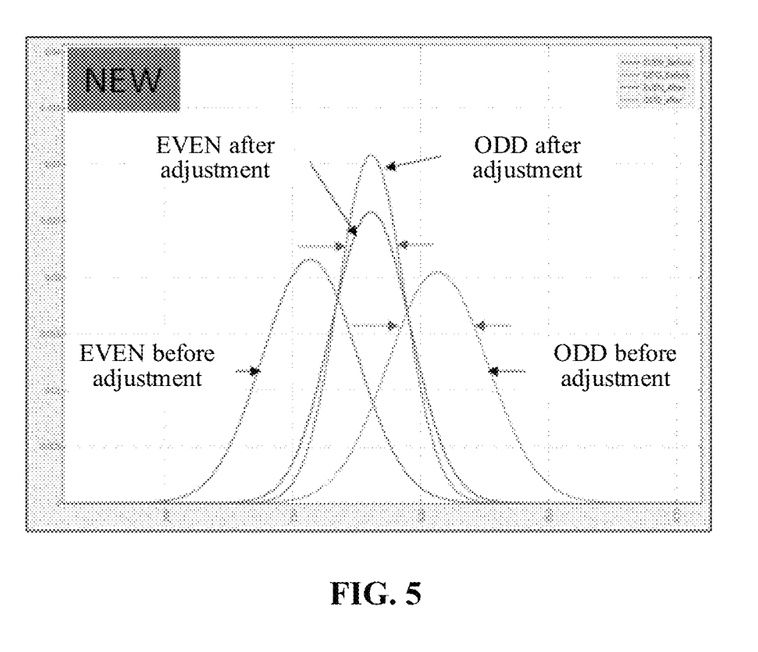
FIG. 5 is a schematic diagram of chip output characteristics adjusted by the technical solution of this application according to embodiments of this application.

Therefore, when the chip to be tested corresponds to the target adjustment solution LEV4, the target E-fuse corresponding to the target adjustment solution can be found as the E-fuse 0 or E-fuse 1 based on the mapping relationship shown in Table 1. The E-fuse 0 or E-fuse 1 is the E-fuse to be blown, and the E-fuse 0 or E-fuse 1 is blown, the output characteristics of the chip to be tested are adjusted by blowing the E-fuse 0 or the E-fuse 1. As shown in FIG. 3, which is a schematic diagram of chip output characteristics according to embodiments of this application, a black hollow arrow in FIG. 3 shows pass window, a black solid arrow shows fail, such that the consistency of the output characteristics of the adjusted chip is ensured. As shown in FIG. 4 and FIG. 5, FIG. 4 is a schematic diagram of chip output characteristics adjusted by a related art according to embodiments of this application, and FIG. 5 is a schematic diagram of chip output characteristics adjusted by the technical solution of this application according to embodiments of this application. It can be seen in combination with FIG. 4 that although a central value of the EVEN data of the output characteristics is close to that of the ODD data after the output characteristics of the chip to be tested are adjusted by adopting the current uniform adjustment solution, the output characteristics are widely distributed, a distribution map of the output characteristics has poor convergence, and the consistency of the output characteristics is poor. It can be seen in combination with FIG. 5 that the target adjustment solution suitable for the chip to be tested is selected for the chip to be tested in a target manner based on the technical solution provided by the embodiments of this application, and after the output characteristics of the chip to be tested are adjusted based on the target adjustment solution, not only the central value of the EVEN data of the output characteristics is close to that of the ODD data, but also the output characteristics are narrowly distributed, the distribution map of the output characteristics has poor convergence, the consistency of the output characteristics is better, such that the consistency of the output characteristics of the adjusted chip is ensured.

A single chip to be tested is only taken as an example above. When the chip to be tested includes a plurality of chips, the adjustment method for the chip output characteristics is similar to that for the output characteristics when the chip to be tested is a single chip, specifically referring to the specific implementation of the adjustment method for the output characteristics of the single chip. Herein, for the adjustment method for the output characteristics of the plurality of chips, details are not made in the embodiments of this application.

According to the adjustment method and device for the chip output characteristics provided by the embodiments of this application, when the output characteristics of the chip to be tested are adjusted, it is determined whether the output characteristics of the chip to be tested have been adjusted according to the state of each E-fuse. When determining that the output characteristics of the chip to be tested have not been adjusted, the target adjustment solution corresponding to the chip is determined among a plurality of adjustment solutions in a targeted manner according to the output performance of the chip to be tested, and the E-fuse in the chip to be tested is subjected to blowing treatment according to the target adjustment solution, so as to adjust the output characteristics of the chip to be tested. The adjustment on the chip output characteristics is achieved during the testing process, such that the consistency of the output characteristics of the adjusted chip is ensured.

Figure 6:
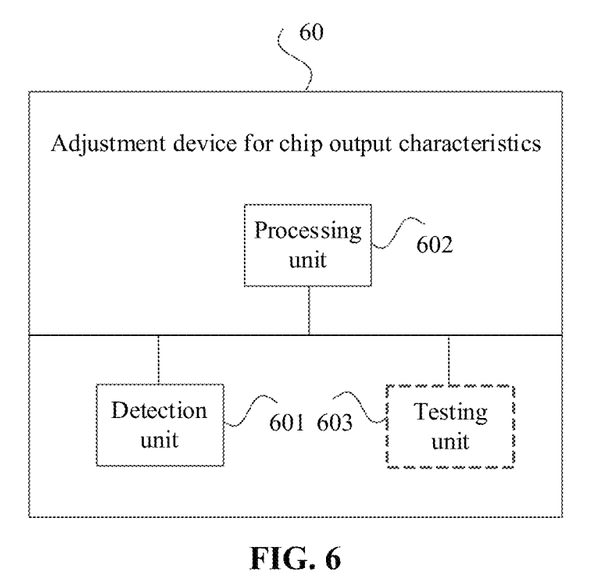
FIG. 6 is a structural schematic diagram of an adjustment device for chip output characteristics according to embodiments of this application.

FIG. 6 is a structural schematic diagram of an adjustment device 60 for chip output characteristics according to embodiments of this application. Exemplarily, as shown in FIG. 6, the adjustment device 60 for chip output characteristics can include a detection unit 601 and a processing unit 602.

The detection unit 601 is configured to detect the state of each E-fuse in a chip to be tested.

The processing unit 602 is configured to determine a target adjustment solution corresponding to the chip among a plurality of adjustment solutions according to the output performance of the chip to be tested if detecting that no E-fuse is blown; and to perform blowing treatment on the E-fuse in the chip to be tested according to the target adjustment solution, so as to adjust the output characteristics of the chip to be tested.

Optionally, the processing unit 602 is specifically configured to fuse the E-fuse corresponding to the target adjustment solution in the chip to be tested.

Optionally, the processing unit 602 is specifically configured to determine the target E-fuse corresponding to the target adjustment solution in the chip to be tested according to the mapping relationship between the adjustment solution and the E-fuse; and to fuse the target E-fuse and turn off other E-fuses other than the target E-fuse in the chip to be tested.

Optionally, the output performance is two groups of data description output by the clock signal. The processing unit 602 is specifically configured to calculate the absolute difference of two groups of data of the chip to be tested by adopting the plurality of adjustment solutions, and to determine the target adjustment solution corresponding to the chip to be tested in the plurality of adjustment solutions according to the plurality of absolute differences.

Optionally, the processing unit 602 is specifically configured to determine the minimum absolute difference in the plurality of absolute differences, and determine the adjustment solution corresponding to the minimum absolute difference as the target adjustment solution corresponding to the chip to be tested.

Optionally, the processing unit 602 is further configured to turn off the chip to be tested if detecting at least one E-fuse in the chip to be detected is blown.

Optionally, the detection unit 601 is further configured to detect the state of each E-fuse again in the chip to be tested.

The processing unit 602 is further configured to detect the blowing result of the E-fuse according to the state of each E-fuse.

Optionally, the adjustment device 60 for the chip output characteristics further includes a testing unit 603.

The testing unit 603 is further configured to test the initial output characteristics of the chip to be tested, and the initial output characteristics are obtained by testing before the E-fuse in the chip to be tested is subjected to blowing treatment.

The processing unit 602 is further configured to compare the initial output characteristics with the output characteristics of the adjusted chip to be tested, so as to determine the adjustment effect.

Optionally, the processing unit 602 is further configured to recover the output characteristics of the chip to be tested to the initial output characteristics before the blowing treatment.

The adjustment device 60 for the chip output characteristics shown in the embodiments of this application can execute the adjustment method for the chip output characteristics shown in any embodiment above. The implementation principle and beneficial effect are similar to those of the adjustment method for the chip output characteristics, and the implementation principle and beneficial effect of the adjustment method for the chip output characteristics can be referred. Details are not made herein.

Figure 7:
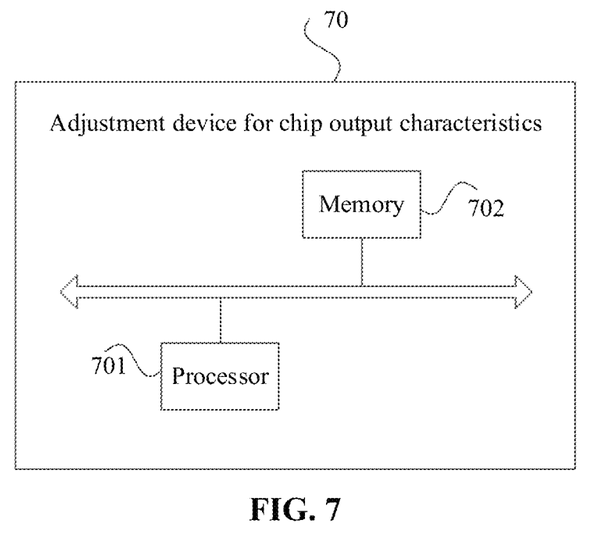
FIG. 7 is a structural schematic diagram of another adjustment device for chip output characteristics according to embodiments of this application.

FIG. 7 is a structural schematic diagram of another adjustment device 70 for chip output characteristics according to embodiments of this application. Exemplarily, as shown in FIG. 7, the adjustment device 70 for chip output characteristics includes a memory 702 and a processor 701.

The memory 702 is configured to store a computer program.

The processor 701 is configured to read the computer program stored in the memory, and to execute the adjustment method for the chip output characteristics in any one embodiment according to the computer program in the memory 702, the implementation principle and beneficial effect of the adjustment method for the chip output characteristics can be referred. Details are not made herein.

The embodiments of this application further provide a readable memory medium, which is configured to store an instruction. When the instruction is executed, the adjustment method for the chip output characteristics shown in any embodiment above is implemented. The implementation principle and beneficial effect are similar to those of the adjustment method for the chip output characteristics. Details are not made herein.

In the embodiments of the application, it should be understood that the disclosed device and method can be implemented through other manners. For example, the embodiment of the device described above is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the devices or units may be implemented in electronic, mechanical, or other forms.

The units described as separate parts may or may not be physically separate, and parts displayed as units may or may not be physical units, namely, may be located in one location, or may be distributed on a plurality of network units. Some or all of the units may be selected according to actual needs to achieve the objective of the solutions of the embodiments. In addition, functional units in each embodiment of this application may be integrated into one processing unit, or each unit may have separate physical existence, or two or more units may be integrated in one unit. The integrated module may be implemented in a hardware form, or may be implemented in form of hardware and software function unit.

The integrated module implemented in form of a software function module may be stored in a computer-readable storage medium. The software function module is stored in a storage medium, including a plurality of instructions configured to enable a computer device (which may be a personal computer, a server, a network device, etc.) or a processor to execute part of the steps of the method in each embodiment of the application.

It is to be understood that the processor may be a Central Processing Unit (CPU), or may be another general-purpose processor, a Digital Signal Processor (DSP), an Application Specific Integrated Circuit (ASIC), etc. The general-purpose processor may be a microprocessor, or the processor may also be any conventional processor, etc. The steps of the method disclosed in combination with the application may be directly embodied to be executed and completed by a hardware processor or executed and completed by a combination of hardware and software modules in the processor.

The memory may include a high-speed Random Access Memory (RAM), or may include a Non-Volatile Memory (NVM), for example, at least one disk memory, or may be a U disk, a mobile hard disk, a read-only memory, a magnetic disk, an optical disk, etc.

The bus may be an Industry Standard Architecture (ISA) bus, a Peripheral Component Interconnect (PCI) bus, an Extended Industry Standard Component (EISA) bus, etc. The bus may be divided into an address bus, a data bus, a control bus, etc. For ease of representation, the bus in the drawings of the application is not limited to one bus or one type of bus.

The above computer-readable storage medium may be implemented by a volatile or non-volatile storage device of any type or a combination thereof, for example, a Static Random Access Memory (SRAM), an Electrically Erasable Programmable Read-Only Memory (EEPROM), an Erasable Programmable Read-Only Memory (EPROM), a Programmable Read-Only Memory (PROM), a ROM, a magnetic memory, a flash memory, a magnetic disk or an optical disk. The storage medium may be any available medium accessible for a universal or dedicated computer.

Finally, it should be noted that the above embodiments are merely used for illustrating the technical solution of this application instead of limiting it. Although this application is described in details with reference to the abovementioned embodiments. Those of ordinary skill in the art should understand that they can still make modifications to the technical solution recorded in the abovementioned embodiments, or make equivalent replacements to part or all of technical characteristics. However, these modifications or replacement do not separate the nature of the corresponding technical solution from the scope of the technical solution of various embodiments of this application.

What is claimed is:

1. An adjustment method for chip output characteristics, comprising:
    detecting a state of each of a plurality of Electrically Programmable Fuses (E-fuses) in a chip to be tested;
    determining a target adjustment solution corresponding to the chip among a plurality of adjustment solutions according to an output performance of the chip to be tested when detecting that no E-fuse is blown;
    determining a target E-fuse corresponding to the target adjustment solution among the plurality of E-fuses in the chip to be tested according to a mapping relationship between the adjustment solution and the target E-fuse; and
    blowing the target E-fuse and closing other E-fuses other than the target E-fuse among the plurality of E-fuses in the chip to be tested,
    so as to adjust an output characteristics of the chip to be tested.

2. The method of claim 1, wherein the output performance is two groups of data description output by a clock signal, and said determining the target adjustment solution corresponding to the chip in the plurality of adjustment solutions according to the output performance of the chip to be tested comprises:
    respectively calculating absolute differences of the two groups of data of the chip to be tested by adopting the plurality of adjustment solutions; and
    determining the target adjustment solution corresponding to the chip to be tested in the plurality of adjustment solutions according to the plurality of absolute differences.

3. The method of claim 2, wherein said determining the target adjustment solution corresponding to the chip to be tested in the plurality of adjustment solutions according to the plurality of absolute differences comprises:
    determining the minimum absolute difference in the plurality of absolute differences; and
    determining the adjustment solution corresponding to the minimum absolute difference as the target adjustment solution corresponding to the chip to be tested.

4. The method of claim 1, further comprising:
    turning off the chip to be tested when detecting at least one E-fuse in the chip is blown.

5. The method of claim 1, wherein after said blowing the E-fuse in the chip to be tested according to the target adjustment solution, the method further comprises:
    detecting the state of each E-fuse in the chip to be tested again; and
    detecting a blowing result of the E-fuse according to the state of each E-fuse.

6. The method of claim 1, further comprising:
    testing the initial output characteristics of the chip to be tested, and the initial output characteristics being obtained by testing before the E-fuse in the chip to be tested being subjected to blowing treatment; and
    comparing the initial output characteristics with the output characteristics of the adjusted chip to be tested, so as to determine the adjustment effect.

7. The method of claim 1, wherein after said blowing the E-fuse in the chip to be tested according to the target adjustment solution, the method further comprises:
    recovering the output characteristics of the chip to be tested to the initial output characteristics before the blowing treatment.

8. An adjustment device for chip output characteristics, comprising a memory and a processor, wherein
    the memory is configured to store a computer program; and
    the processor is configured to read the computer program stored in the memory, and to execute the method claim 1.

9. The adjustment device of claim 8, wherein the output performance is two groups of data description output by a clock signal, and said determining the target adjustment solution corresponding to the chip in the plurality of adjustment solutions according to the output performance of the chip to be tested comprises:
    respectively calculating absolute differences of the two groups of data of the chip to be tested by adopting the plurality of adjustment solutions; and
    determining the target adjustment solution corresponding to the chip to be tested in the plurality of adjustment solutions according to the plurality of absolute differences.

10. The adjustment device of claim 9, wherein said determining the target adjustment solution corresponding to the chip to be tested in the plurality of adjustment solutions according to the plurality of absolute differences comprises:
    determining the minimum absolute difference in the plurality of absolute differences; and
    determining the adjustment solution corresponding to the minimum absolute difference as the target adjustment solution corresponding to the chip to be tested.

11. The adjustment device of claim 8, wherein the method further comprises:
    turning off the chip to be tested when detecting at least one E-fuse in the chip is blown.

12. The adjustment device of claim 8, wherein the method further comprises:
    detecting the state of each E-fuse in the chip to be tested again; and
    detecting a blowing result of the E-fuse according to the state of each E-fuse.

13. The adjustment device of claim 8, wherein the method further comprises:
    testing the initial output characteristics of the chip to be tested, and the initial output characteristics being obtained by testing before the E-fuse in the chip to be tested being subjected to blowing treatment; and
    comparing the initial output characteristics with the output characteristics of the adjusted chip to be tested, so as to determine the adjustment effect.

14. The adjustment device of claim 8, wherein the method further comprises:
    recovering the output characteristics of the chip to be tested to the initial output characteristics before the blowing treatment.

15. An adjustment device for chip output characteristics, comprising:
  a detector, which is configured to detect the state of each of a plurality of E-fuses in a chip to be tested; and
  a processor configured to
  determine a target adjustment solution corresponding to the chip among a plurality of adjustment solutions according to the output performance of the chip to be tested if detecting that no E-fuse is blown;
  perform blowing treatment on one of the plurality of E-fuses in the chip to be tested according to the target adjustment solution, so as to adjust the output characteristics of the chip to be tested; and
  recover the output characteristics of the chip to be tested to the initial output characteristics before the blowing treatment.

16. An adjustment method for chip output characteristics, comprising:
  detecting a state of each of a plurality of Electrically Programmable Fuses (E-fuses) in a chip to be tested;
  determining a target adjustment solution corresponding to the chip among a plurality of adjustment solutions according to an output performance of the chip to be tested when detecting that no E-fuse is blown; and
  performing blowing treatment on one of the plurality of E-fuses in the chip to be tested according to the target adjustment solution, so as to adjust an output characteristics of the chip to be tested;
  wherein the output performance is two groups of data description output by a clock signal, and said determining the target adjustment solution corresponding to the chip in the plurality of adjustment solutions according to the output performance of the chip to be tested comprises:
  respectively calculating absolute differences of the two groups of data of the chip to be tested by adopting the plurality of adjustment solutions; and
  determining the target adjustment solution corresponding to the chip to be tested in the plurality of adjustment solutions according to the plurality of absolute differences.

17. The method of claim 16, wherein said performing blowing treatment on the E-fuse in the chip to be tested among the plurality of E-fuses according to the target adjustment solution comprises:
  determining a target E-fuse corresponding to the target adjustment solution among the plurality of E-fuses in the chip to be tested according to a mapping relationship between the adjustment solution and the E-fuse;
  blowing the target E-fuse and closing other E-fuses other than the target E-fuse among the plurality of E-fuses in the chip to be tested.

18. The method of claim 16, wherein the determining the target adjustment solution corresponding to the chip to be tested in the plurality of adjustment solutions according to the plurality of absolute differences comprises:
  determining the minimum absolute difference in the plurality of absolute differences; and
  determining the adjustment solution corresponding to the minimum absolute difference as the target adjustment solution corresponding to the chip to be tested.

19. The method of claim 16, wherein after the blowing the E-fuse in the chip to be tested according to the target adjustment solution, the method further comprises:
  detecting the state of each E-fuse in the chip to be tested again; and
  detecting a blowing result of the E-fuse according to the state of each E-fuse; and
  the method further comprises:
  testing the initial output characteristics of the chip to be tested, and the initial output characteristics being obtained by testing before the E-fuse in the chip to be tested being subjected to blowing treatment; and
  comparing the initial output characteristics with the output characteristics of the adjusted chip to be tested, so as to determine the adjustment effect.

20. The method of claim 16, wherein after the blowing the E-fuse in the chip to be tested according to the target adjustment solution, the method further comprises:
  recovering the output characteristics of the chip to be tested to the initial output characteristics before the blowing treatment.

* * * * *